United States Patent [19]
Jennings

[11] Patent Number: 5,764,002
[45] Date of Patent: Jun. 9, 1998

[54] OVER-CURRENT PROTECTION CIRCUIT FOR USE IN TELEVISION HORIZONTAL DEFLECTION CIRCUITS

[75] Inventor: James R. Jennings, Knoxville, Tenn.

[73] Assignee: U.S. Philips Corporation, New York, N.Y.

[21] Appl. No.: 673,996

[22] Filed: Jul. 1, 1996

[51] Int. Cl.$^6$ .............................. G09G 1/04; H01J 29/54; H04N 5/68

[52] U.S. Cl. .................. 315/408; 315/386; 315/387; 348/380

[58] Field of Search .................. 315/408, 384–387, 315/411; 348/173, 378, 380, 730

[56] References Cited

U.S. PATENT DOCUMENTS

| | | | |
|---|---|---|---|
| 4,042,858 | 8/1977 | Collette et al. | 315/379 |
| 4,074,323 | 2/1978 | Griffey | 315/411 |
| 4,185,234 | 1/1980 | Baker | 315/411 |
| 4,412,157 | 10/1983 | Gamboa | 315/387 |
| 4,885,509 | 12/1989 | Ikeuchi | 315/411 |

FOREIGN PATENT DOCUMENTS

| | | |
|---|---|---|
| 2750213 | 9/1987 | Germany. |
| 07298085 | 10/1995 | Japan. |

*Primary Examiner*—Gregory C. Issing
*Attorney, Agent, or Firm*—Edward W. Goodman

[57] ABSTRACT

A horizontal deflection circuit includes circuitry for protecting the horizontal output transistor from failure due to an over-current condition. The circuitry includes a current detector for detecting the current in the collector-emitter path of the horizontal output transistor, and a interrupter for interrupting the drive signal to the horizontal output transistor when the detected current exceed a predetermined level.

7 Claims, 1 Drawing Sheet

OVER-CURRENT PROTECTION CIRCUIT FOR USE IN TELEVISION HORIZONTAL DEFLECTION CIRCUITS

BACKGROUND OF THE INVENTION

1. Field of The Invention

The subject invention relates to horizontal deflection circuits in television receivers, and more particularly, to the horizontal output transistors used in such circuits.

2. Description of The Related Art

In a typical cathode ray tube (CRT) television receiver, as shown in FIG. 1, a high voltage supply derived from the AC line is used to provide the DC collector supply voltage B+ for the horizontal deflection output transistor Q1. The collector supply voltage B+ is coupled through the primary of the flyback transformer T1 to the horizontal output transistor Q1. As is well known, the horizontal output transistor Q1 is used to supply an alternating current to the primary of the flyback transformer T1. This current, in turn, induces a relatively high voltage in the flyback secondary from which is derived the anode voltage for the CRT. Additionally, a horizontal deflection coil $L_y$ in series with a capacitor $C_s$ is connected to the collector of the horizontal output transistor Q1.

The base of the horizontal output transistor Q1 is coupled through a resistor R1 to the secondary winding of a drive transformer T2. The primary winding of the drive transformer T2 connects the above-noted DC collector supply voltage B+ to the collector of a horizontal drive transistor Q2. The base of the horizontal drive transistor Q2 then receives horizontal signals from the horizontal oscillator.

Ordinarily, the horizontal output transistor is dimensioned such that it operates in saturation. However, situations arise causing the horizontal output transistor to exceed its safe operating area (SOA). These situations, which may include normal start-up of the television receiver, RF interference, CRT arcing, and lightning transients, cause the normally occurring drive pulses from the horizontal drive transistor to be interrupted. The missing drive pulses cause the horizontal output transistor to turn on longer than normal thus causing a large current to flow through the horizontal output transistor. The flyback eventually saturates causing an even greater increase in the transistor current. The horizontal output transistor does not have enough base drive to handle the large collector current so it pulls out of saturation. The $V_{CE}$ voltage developed at this time may now exceed the SOA of the transistor and as such, failure may result.

U.S. Pat. No. 4,185,234 discloses an isolated B+ voltage sensing and high-voltage shutdown circuit which detects when the B+ voltage exceeds a predetermined level and then stops operation of the horizontal deflection circuit by effectively short circuiting the output from the horizontal oscillator thereby terminating the drive signal for the horizontal drive transistor. While this circuit will stop the operation of the horizontal deflection circuit, it will not detect the over-current conditions on the horizontal output transistor which result from situations other than an over-voltage condition on the high voltage line.

SUMMARY OF THE INVENTION

It is an object of the present invention to prevent the horizontal output transistor from failure due to over-current.

This object is achieved in a horizontal deflection circuit comprising a flyback transformer having a primary winding and a secondary winding, said secondary winding providing an anode voltage for a cathode ray tube; means for supplying a D.C. voltage to a first end of the primary winding of said flyback transformer; a horizontal output transistor having a collector coupled to a second end of the primary winding of the flyback transformer, an emitter coupled to ground and a base; a drive transformer having a primary winding and a secondary winding, said secondary winding having a first end coupled to the base of the horizontal output transistor and a second end coupled to the emitter of said horizontal output transistor, and said primary winding having a first end also coupled to said supplying means; a horizontal drive transistor having a collector coupled to a second end of the primary winding of said drive transformer, an emitter coupled to ground, and a base; means for providing a horizontal drive signal coupled to the base of said horizontal drive transistor; detecting means for detecting a current through a collector-emitter path of said horizontal output transistor; and interrupting means, coupled to said detecting means, for interrupting a drive current to the base of said horizontal output transistor when the collector-emitter path current exceed a predetermined level.

In a preferred embodiment of the invention, the detecting means includes a resistor arranged between the emitter of the horizontal output transistor and ground, and the interrupting means includes a silicon controlled rectifier (SCR) connecting the collector of the horizontal drive transistor to ground. The control electrode of the SCR is coupled to the emitter of the horizontal output transistor.

In the above circuit, when the current sensed through the emitter resistor gets to such a level that the voltage across the emitter resistor exceeds the gate threshold voltage of the SCR, the SCR will turn on thus removing base drive to the horizontal output transistor, thereby turning it off. On the arrival of a next horizontal drive pulse, the horizontal drive transistor is turned on which removes the latch current from the SCR, thereby turning the SCR off and thus resetting the circuit.

Applicant has found that the point were the base drive is removed can be anywhere in the horizontal drive path, even at the base of the horizontal output transistor. The present location is preferred due to low currents less susceptibility to CRT arc currents that may be present at the base of the horizontal output transistor.

BRIEF DESCRIPTION OF THE DRAWINGS

With the above and additional objects and advantages in mind as will hereinafter appear, the invention will be described with reference to the accompanying drawings, in which.

DESCRIPTION OF THE PREFERRED EMBODIMENTS

Figure 1:
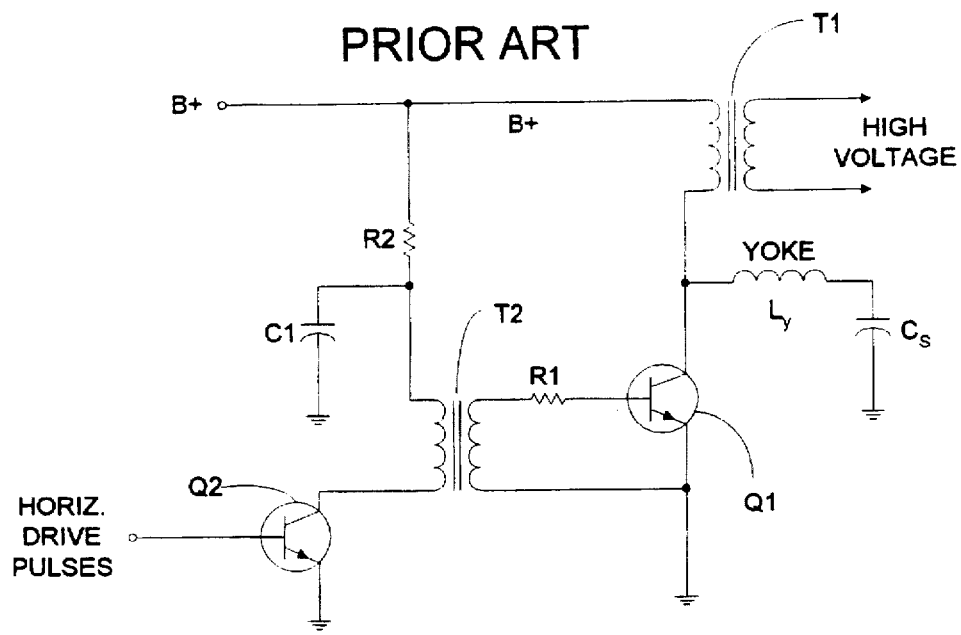
FIG. 1 shows a schematic diagram of a portion of a known horizontal deflection circuit.
Figure 2:
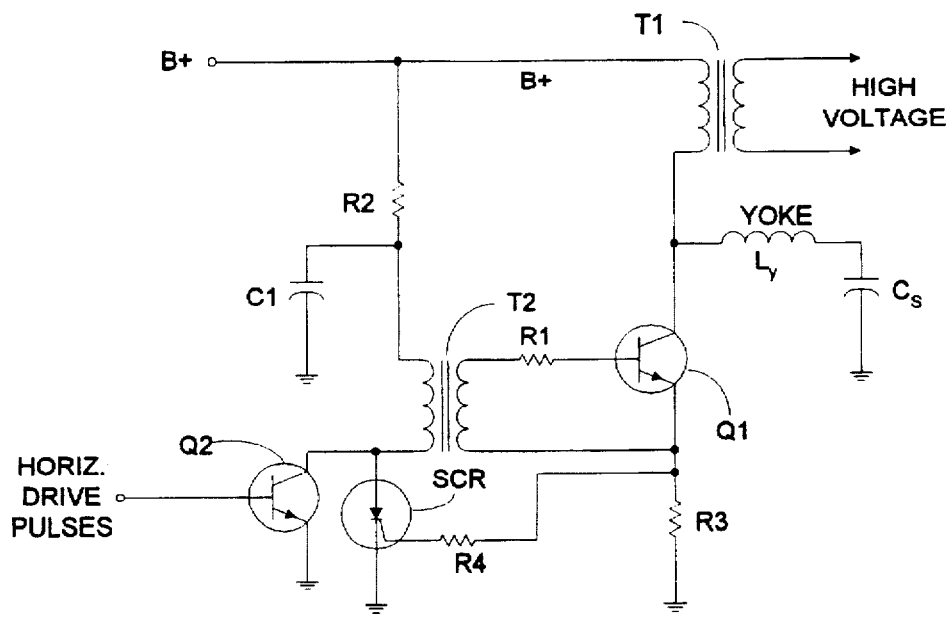
FIG. 2 shows a schematic diagram of a horizontal deflection circuit incorporating the protection circuit of the subject invention.

FIG. 2 shows a portion of horizontal deflection circuit substantially similar to that shown in FIG. 1. In addition, a resistor R3 is inserted between the junction point of the secondary of the horizontal drive transformer T2 and the emitter of the horizontal output transistor Q1 and ground. This resistor R3 then forms detecting means for detecting the current through the collector-emitter path of the horizontal output transistor Q1.

A silicon controlled rectifier SCR is connected between the collector of the horizontal drive transistor Q2 and ground. The control electrode of the SCR is connected, through resistor R4, to the above-noted junction point.

In operation, the current through the resistor R3 causes a voltage to appear across the resistor R3. When this voltage exceeds the gate threshold of the SCR (approx. 0.6 volts), the SCR is turned on thereby short circuiting the drive signal from the horizontal drive transistor Q2 to primary winding of the horizontal drive transformer T2. This removes the drive signal to the base of the horizontal output transistor Q1 thereby shutting it off. While the turning off of the horizontal output transistor Q1 interrupts the current and eliminates the voltage drop across resistor R3, the SCR remains latched due to the current passing through it from the primary winding of the horizontal drive transformer T2. Upon the occurrence of a next horizontal drive pulse on the base of the horizontal drive transistor Q2, this current is drained allowing the SCR to turn off thereby resetting the protection circuit.

Applicant has found that the value of resistor R3 should be approximately 0.075 ohms, with this value being adjustable to determine the "trip point" of the protection circuit. The resistor R4 (approx. 47 ohms) is used to control the sensitivity of the SCR. The low resistance from the gate to cathode results in dv/dt desensitization, anode to gate leakage current desensitization, and greater noise immunity.

With regard to capacitor C1, while in prior art horizontal deflection circuits the value of C1 is usually 1 µF, Applicant has found it necessary to reduce this value to 0.22 µF to allow for a quicker start-up after the SCR unlatches which results in good horizontal drive during restart.

Numerous alterations and modifications of the structure herein disclosed will present themselves to those skilled in the art. However, it is to be understood that the above described embodiment is for purposes of illustration only and not to be construed as a limitation of the invention. All such modifications which do not depart from the spirit of the invention are intended to be included within the scope of the appended claims.

What is claimed is:

1. A horizontal deflection circuit comprising:

a flyback transformer having a primary winding and a secondary winding, said secondary winding providing an anode voltage for a cathode ray tube;

means for supplying a D.C. voltage to a first end of the primary winding of said flyback transformer;

a horizontal output transistor having a collector coupled to a second end of the primary winding of the flyback transformer, an emitter coupled to ground and a base;

a drive transformer having a primary winding and a secondary winding, said secondary winding having a first end coupled to the base of the horizontal output transistor and a second end coupled to the emitter of said horizontal output transistor, and said primary winding having a first end also coupled to said supplying means;

a horizontal drive transistor having a collector coupled to a second end of the primary winding of said drive transformer, an emitter coupled to ground, and a base;

means for providing a horizontal drive signal coupled to the base of said horizontal drive transistor;

detecting means for detecting a current through a collector-emitter path of said horizontal output transistor; and interrupting means, coupled to said detecting means, for interrupting a drive current to the base of said horizontal output transistor when the collector-emitter path current exceed a predetermined level, wherein said interrupting means comprises a controllable switch coupling a path between said horizontal drive transistor and said horizontal output transistor to ground, a control input of said controllable switch being connected to said detecting means.

2. A horizontal deflection circuit as claimed in claim 1, wherein said detecting means comprises a resistor coupled between the emitter of said horizontal output transistor and ground.

3. A horizontal deflection circuit as claimed in claim 1, wherein said controllable switch couples the collector of said horizontal drive transistor to ground.

4. A horizontal deflection circuit as claimed in claim 1, wherein said controllable switch couples the secondary winding of said horizontal drive transformer to ground.

5. A horizontal deflection circuit as claimed in claim 1, wherein said controllable switch comprises a silicon controlled rectifier (SCR).

6. A horizontal deflection circuit as claimed in claim 5, wherein said detecting means comprises a resistor coupled between the emitter of said horizontal output transistor and ground, and a control input of said SCR is coupled to the emitter of said horizontal output transistor.

7. A horizontal deflection circuit as claimed in claim 6, wherein said interrupting means further comprises a resistor connecting the control input of said SCR to the emitter of the horizontal transistor.

* * * * *